(12) United States Patent
Liou et al.

(10) Patent No.: US 9,128,141 B2
(45) Date of Patent: Sep. 8, 2015

(54) MAGNATORESISTIVE SENSING DEVICE AND METHOD FOR FABRICATING THE SAME

(71) Applicant: Voltafield Technology Corp., Zhubei, Hsinchu County (TW)

(72) Inventors: Fu-Tai Liou, Zhubei (TW); Nai-Chung Fu, Zhongli (TW)

(73) Assignee: Voltafield Technology Corp., Zhubei (TW)

( * ) Notice: Subject to any disclaimer, the term of this patent is extended or adjusted under 35 U.S.C. 154(b) by 293 days.

(21) Appl. No.: 13/714,734

(22) Filed: Dec. 14, 2012

(65) Prior Publication Data

US 2014/0111194 A1 Apr. 24, 2014

(30) Foreign Application Priority Data

Oct. 19, 2012 (TW) .............................. 101138834 A

(51) Int. Cl.
*G01R 33/09* (2006.01)
*G01R 33/07* (2006.01)

(52) U.S. Cl.
CPC .............. *G01R 33/09* (2013.01); *G01R 33/093* (2013.01); *G01R 33/07* (2013.01)

(58) Field of Classification Search
CPC .. G01R 33/09; G01R 33/0017; G01R 33/093; G01R 33/096; G01R 33/07; G01R 33/098
USPC ........................................................... 324/252
See application file for complete search history.

(56) References Cited

U.S. PATENT DOCUMENTS

| | | | | |
|---|---|---|---|---|
| 5,260,653 | A * | 11/1993 | Smith et al. | 324/252 |
| 5,965,840 | A * | 10/1999 | Nagarajan et al. | 136/203 |
| 6,917,088 | B2 * | 7/2005 | Takahashi et al. | 257/422 |
| 7,005,958 | B2 * | 2/2006 | Wan | 338/32 R |
| 7,016,163 | B2 * | 3/2006 | Wan et al. | 360/324.1 |
| 7,573,683 | B1 * | 8/2009 | Benakli et al. | 360/319 |
| 7,683,610 | B2 * | 3/2010 | Shimazawa | 324/210 |
| 2001/0013997 | A1 * | 8/2001 | Sasaki et al. | 360/317 |
| 2002/0036497 | A1 * | 3/2002 | Inage et al. | 324/252 |
| 2007/0200565 | A1 * | 8/2007 | Witcraft et al. | 324/252 |
| 2007/0216406 | A1 * | 9/2007 | Witcraft et al. | 324/252 |
| 2009/0190272 | A1 * | 7/2009 | Machita et al. | 360/319 |
| 2011/0062539 | A1 * | 3/2011 | Matsuda et al. | 257/422 |
| 2011/0069413 | A1 * | 3/2011 | Maat et al. | 360/234.3 |
| 2011/0233697 | A1 * | 9/2011 | Kajiyama | 257/421 |
| 2012/0081110 | A1 * | 4/2012 | Racz | 324/252 |
| 2012/0182010 | A1 * | 7/2012 | Lammel et al. | 324/244 |

* cited by examiner

*Primary Examiner* — Jermele M Hollington
*Assistant Examiner* — Christopher McAndrew
(74) *Attorney, Agent, or Firm* — Alan D. Kamrath

(57) ABSTRACT

A magnetoresistive sensing device includes a substrate, a magnetoresistive sensing element, a circuitry element and a shielding unit. The magnetoresistive sensing element, the circuitry element and the shielding unit are disposed at the same side of the substrate. The shielding unit is between the magnetoresistive sensing element and the circuitry element. The shielding unit comprises at least one magnetic material.

19 Claims, 5 Drawing Sheets

MAGNATORESISTIVE SENSING DEVICE AND METHOD FOR FABRICATING THE SAME

FIELD OF THE INVENTION

The present invention relates to a magnetoresistive sensing device and particularly to a magnetoresistive sensing device with a shielding unit.

BACKGROUND OF THE INVENTION

An electrical current flowing in a conductor would create magnetic field. In general, a change of a specific magnetic field to be measured by a magnetoresistive sensing device is very small and the worst thing is that inevitably there are a lot of circuitry, active devices, passive devices and/or interconnect within/around a magnetoresistive sensing device creating interfering magnetic fields, thereby affecting the measuring accuracy of the magnetoresistive sensing device. Therefore, a solution is needed to address this problem.

SUMMARY OF THE INVENTION

A purpose of this invention is to provide a magnetoresistive sensing device with a shielding unit to satisfy the need of measuring accuracy.

This invention discloses a magnetoresistive sensing device includes a substrate, a magnetoresistive sensing element, a circuit element and a shielding unit, wherein the shielding unit is between the magnetoresistive sensing element and the circuit element and comprises at least one magnetic material.

In one embodiment, the magnetoresistive sensing element, the circuit element and the shielding unit are disposed along a direction parallel or perpendicular to a surface of the substrate.

In one embodiment, the magnetoresistive sensing element comprises a first magnetic layer not parallel to the substrate surface and the shielding unit comprises a second magnetic layer not parallel to the first magnetic layer, wherein the first magnetic layer and the second magnetic layer comprise the same magnetic material.

In one embodiment, the shielding unit further comprises a third magnetic layer, wherein the third magnetoresistive is at the periphery of the second magnetic layer and the second magnetic layer is at the periphery of the first magnetic layer.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
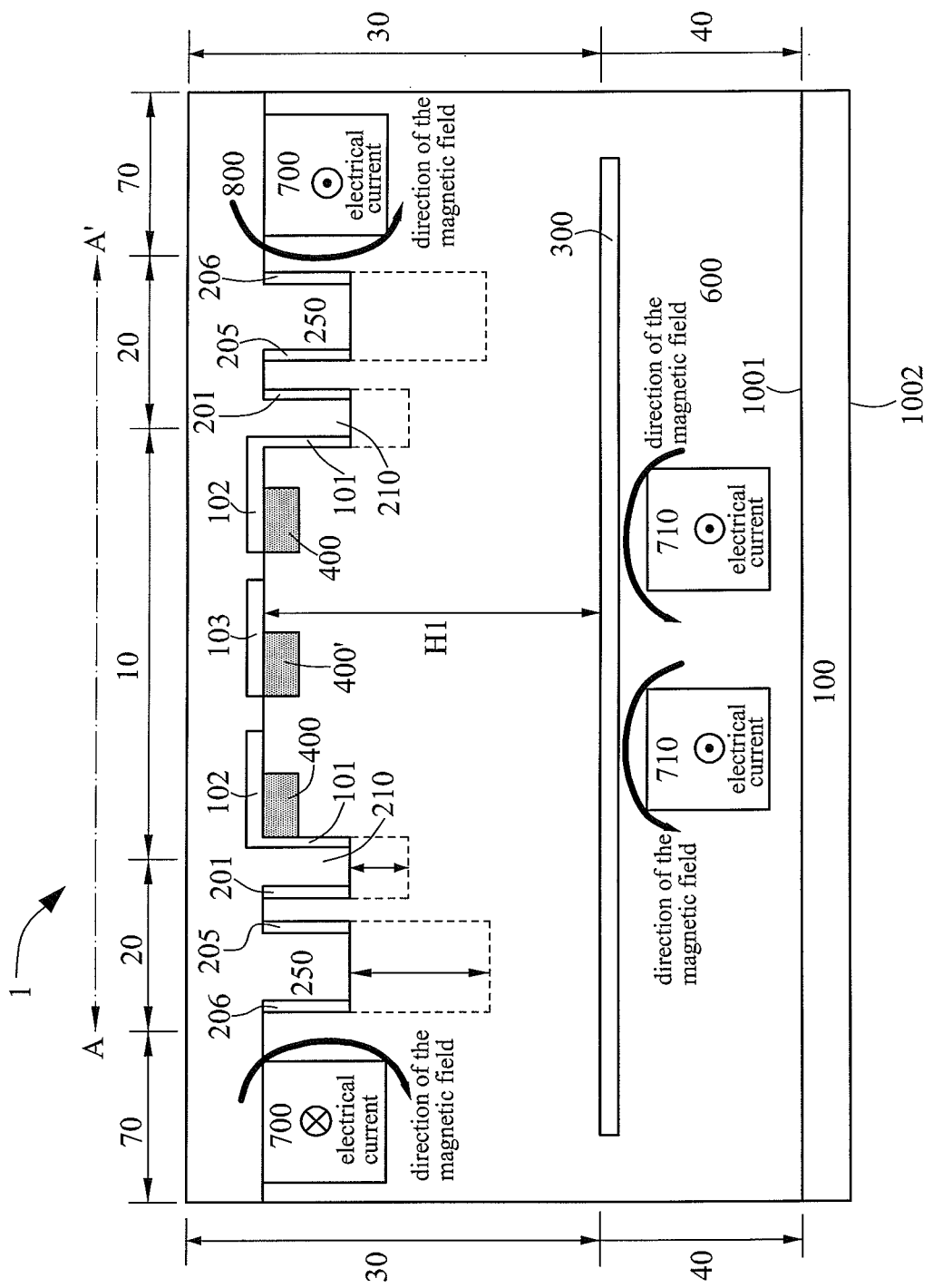
FIG. 1 is a detailed cross section view of a magnetoresistive sensing device in accordance with an embodiment of the present invention.

The present invention focuses on a magnetoresistive sensing device with a magnetoresistive sensing element, a circuit element and a shielding unit, however, this magnetoresistive sensing device may further comprise other commonly used structures or elements such as built-in self test unit, set/reset circuit, various circuitry comprising amplifiers, filters, converter . . . etc. and interconnects. To clearly illustrate this invention and not to obscure its focus, the descriptions of these commonly used structures or elements are omitted, but it does not mean the magnetoresistive sensing device of the present invention can not optionally comprise these structures or elements.

The following is the detailed description of the preferred embodiments of this invention. All the elements, sub-elements, structures, materials, arrangements recited herein can be combined in any way and in any order into new embodiments, and these new embodiments should fall in the scope of this invention. A person skilled in the art, upon reading this invention, should be able to modify and change the elements, sub-elements, structures, materials, arrangements recited herein without being apart from the principle and spirit of this invention. Therefore, these modifications and changes should fall in the scope of this invention defined only by the following claims.

There are a lot of embodiments and figures in this application. To avoid confusions, similar components are represented by same or similar numerals. To avoid complexity and confusions, only one of the repetitive components is marked. Figures are meant to deliver the principle and spirits of this invention, so the distance, size, ratio, shape, connection relationship, etc. are examples instead of realities. Other distance, size, ratio, shape, connection relationship, etc. capable of achieving the same functions or results can be adopted as equivalents.

In the context of the present invention, the terms "magnetic layer", "magnetoresistive material" or "magnetic material" all mean a single or multiple discrete or continuous film/stacked films whose resistance would change due to an external magnetic field along a specific direction. They can comprise anisotropic magnetoresistance material (AMR), giant magnetoresistance material (GMR), tunneling magnetoresistance material (TMR), ferromagnet material, antiferromagnet material, non-ferromagnet material, tunneling oxide, or any combination thereof. The terms "magnetic layer" or "magnetoresistive material" preferably comprise anisotropic magnetoresistance material (AMR) especially permalloy. In the context of the present invention, the terms "conductor" or "interconnect" both mean a conductive structure without shape limitation. They can comprise metal, alloy, salicide, nanotube, conductive carbon material, doped silicon, etc. They can have the following structures: a long strip, discrete islands, a sheet, through vias, a single damascene structure or a dual damascene structure, or a combination thereof along vertical or horizontal direction. In the context of the present invention, the phrase "A is magnetically coupled to B" means magnetic flux lines going through one of A and B would be affected by the other of A and B, thereby redirecting or concentrating the magnetic flux lines. Therefore, the phrase "A is magnetically coupled to B" can represent a situation where A is in physical contact with B or a situation where A and B are close enough to magnetically affect each other without physically contacting each other. Specifically, when A is magnetically coupled to B, a magnetic flux passing through one of A and B would be guided/redirected by the other one of A and B. In the context of the present invention, the term "electrically floating" means electrically connected to no power supply, no ground and electrically isolated from other devices/circuitry. In the context of the present invention, the term "magnetic field" or "magnetic field of a specific direction" represents a net magnetic field at a specific location taking effect of magnetic fields from different sources or a magnetic field at a specific location from a specific source without considering other sources or a magnetic component of a specific direction. In the context of the present invention, the phrase "A is electrically coupled to B" means electrical current can flow from one of A and B to the other of A and B, so "A is electrically coupled to B" can represent a situation where A is in physical contact with B or a situation where there is one or more conductive structure/substance between A and B so as to make electrical communication occurs between A and B.

Now refer to FIG. 1, FIG. 1 is a detailed cross section view of a magnetoresistive sensing device 1 in accordance with an embodiment of the present invention. The magnetoresistive sensing device 1 comprises a substrate 100, all the regions above the substrate and all the elements in all the regions. The substrate 100 comprises a first surface 1001 and a second surface 1002 opposite to the first surface 1001. The space above the first surface 1001 along the vertical direction comprises a first region 30 and a second region 40 from top to bottom. The first region 30 and second region 40 are disposed within a dielectric layer 600 and a passivation layer 600. The first region is divided to a sensing region 10, a shielding region 20 and a periphery circuitry region 70 from inside to outside.

The sensing region 10 comprises at least one magnetoresistive sensing element. In FIG. 1, three magnetoresistive sensing elements are shown and they comprise two first magnetic layers 101, two first extensions 102 of the first magnetic layers and one horizontal magnetic layer 103, but they may comprise other layers or elements that are not shown in the figure due to simplicity. In this embodiment, the first magnetic layers 101 not parallel to the first surface 1001 are configured to sense a magnetic field perpendicular to the first surface 1001. The optional horizontal magnetic layer 103 parallel to the first surface 1001 is configured to sense a magnetic field parallel to the first surface 1001. The first magnetic layers 101 not parallel to the first surface is preferably substantially perpendicular to the first surface 1001 and optionally comprises first extensions 102 parallel to the first surface 1001 at its upper end. However, due to deviations caused by a manufacturing process or a design need, the first magnetic layers 101 may form an angle less or more than 90 degree with respect to the surface 1001. Since the first magnetic layers are magnetically coupled to the first extensions 102, a magnetic field perpendicular to the first surface 1001 felt by the first magnetic layers 101 would be redirected (or guided) to influence the first extensions 102, thereby changing a combined resistance of the first magnetic layers 101 and the extensions 102. Although not shown in the figure, the magnetic layers 101 may comprise other horizontal extensions at its lower end and magnetically coupled thereto. The first magnetic layers 101, the extensions 102 and the horizontal magnetic layer 103 all comprise at least one magnetoresistive material or a magnetic material. In FIGS. 1 and 1C, there are conductive portions 400'/400 (when the conductive portion 400' takes a form of a long strip extending along a direction not parallel to the extension direction of the horizontal magnetic layer 103, it is called barber pole; the conductive portion 400 may take a form other than a long strip) disposed under the horizontal magnetic layer 103 and first extensions 102 and physically connected thereto so as to change a directions of electrical currents flowing in the horizontal magnetic layer 103 and first extensions 102. By adding conductive portions, the electrical current flowing in the magnetoresistive/magnetic material would form an angle with respect to a direction of a magnetization of the magnetic material, so sensibility of the magnetic material can be increased. However, a person skilled in the art should understand that the conductive portions 400'/400 may be disposed above the horizontal magnetic layer 103 and physically connected thereto and this modification also falls into the scope of the present invention. Even though in the figure the sensing region 10 only comprises all the magnetic layers stated earlier, a person skilled in the art should know there may be other devices or circuitry that have to work with the magnetoresistive sensing element closely such as build-in self test unit, compensating unit, set/reset circuit, etc.

The shielding region 20 comprises at least a first shielding unit. In the figure, the first shielding unit comprises a second magnetic layer 201 not parallel to the first surface 1001 and configured to shield the first magnetic layer 101 from being affected by conductors in the periphery circuitry region. The second magnetic layer 201 and the first magnetic layer 101 are at two opposite sides of a trench 210 and there is a passivation layer 800 between the second magnetic layer 201 and the first magnetic layer 101. The second magnetic layer 201 and the first magnetic layer 101 both comprise at least one magnetoresistive material or magnetic material, they may use the same material or different materials. The passivation layer 800 comprises a dielectric material such as silicon oxide, silicon carbide, silicon nitride or a combination thereof. The second magnetic layer 201 and the first magnetic layer 101 may be disposed at the sidewalls of the trench 210. The first shielding unit may further comprise two third magnetic layers 205 and 206 not parallel to the first surface 1001 and configured to enhance the shielding effect. The third magnetic layer 205 and the third magnetic layer 206 are at two opposite sides of a trench 250 and there is a passivation layer 800 between the third magnetic layer 205 and the third magnetic layer 206. The passivation layer 800 comprises a dielectric material such as silicon oxide, silicon carbide, silicon nitride or a combination thereof. Although not shown in the figure, the first shielding unit may further comprise other magnetic layers or devices.

It is noted that the second magnetic layer and third magnetic layer of the first shielding unit comprise at least a magnetoresistive material or a magnetic material and when they comprise a magnetoresistive material, this magnetoresistive material can be the same material used by the first magnetic layer or a different material from the one used by the first magnetic layer. Furthermore, the third magnetic layer 205 and 206 of the first shielding unit are electrically floating while the second magnetic layer 201 of the first shielding unit is physically connected or electrically coupled to the first magnetic layer 101 of the magnetoresistive sensing element. Since the first magnetic layer 101 of the magnetoresistive sensing element is configured to sense a external magnetic field and is magnetically coupled to the first extension 102 that a electrical current would flow through (that is the first magnetic layer 101 is physically connected to the first extension 102 or not physically connected to the first extension 102 but close enough), the second magnetic layer 201 of the first shielding unit may be electrically floating or electrically coupled to the first extension 102 of the magnetoresistive sensing element. The widths of the trenches 210 and 250 (that is the distance between the magnetic layers at the opposite sides of the trench) may be the same or different. The trenches 210 and 250 may have the same depth, that is the second magnetic layer 201 and the third magnetic layer have the same height along a direction perpendicular to the first surface 1001. Or the trenches 210 and 250 may have different depths, that is, the second magnetic layer 201 and the third magnetic layer have different heights along a direction perpendicular to the first surface 1001. As shown by the dash lines below the trenches 210 and 250 (D1 and D2 represent the part deeper than the original depth), trench 250 preferably has a depth greater than the one of the trench 210. Similarly, the widths of the trench 210 and 250 may be the same or different, that is, the distances between two magnetic layers at two opposite sides of the trenches may be the same or different. The trenches 210 and 250 may both take a form of rectangular trench or both comprise multiple discrete trenches respectively. Or one of them takes a form of rectangular trench and the other comprises multiple discrete trenches. A rectangular trench renders the magnetic layer of the first shielding unit on the sidewall a long strip and multiple discrete trenches render the magnetic layer of the first shielding unit on the sidewall comprise multiple island-shaped sub-portions.

The periphery circuitry region 70 comprises a first circuitry element comprising at least a first conductive part 700. The first circuitry element may be an interconnect, a signal processing circuit, a computing circuit, a memory device, a passive device such as a resistor, a capacitor, a inductor or a combination thereof. Regardless of its kind, when electrical current flows in the first conductive part 700, it would create an internal magnetic field around it. When this magnetic field comprises a magnetic component perpendicular to the first surface 1001, it would be sensed by the first magnetic layer close by and affect an ability of the first magnetic layer to sense external magnetic fields. The term "internal" means within the same chip or die and the term "external" means outside the chip or die. In other words, the magnetic field component perpendicular to the first surface 1001 created by the electrical current flowing in the first conductive part 700 would adversely affect the magnetoresistive sensing element. For example in this embodiment, the conductive part 700 at right side has an electrical current flowing straight out of the paper surface, so it would create a magnetic field of counter clockwise direction; for the first magnetic layer 101 at right side near the conductive part 700, the magnetic field has a magnetic field component pointing down there. Similarly, the conductive part 700 at left side has an electrical current flowing straight into of the paper surface, so it would create a magnetic field of clockwise direction; for the first magnetic layer 101 at left side near the conductive part 700, the magnetic field has a magnetic field component pointing down there.

In this embodiment, the magnetoresistive sensing element, first shielding unit and the first circuitry element are disposed along a direction parallel to the first surface 1001. The first shielding unit between the magnetoresistive sensing element and the first circuitry element would shield the noise (internal magnetic field) created by the first circuitry element from affecting the magnetoresistive sensing element, thereby increasing the sensing ability of the magnetoresistive sensing element.

Next, still refer to FIG. 1. The second region 40 along a vertical direction may comprise a second circuitry element and a second shielding unit from bottom to top. The magnetoresistive sensing element, second shielding unit and second circuitry element are disposed along a direction perpendicular to the first surface 1001. The second circuitry element is similar to the first circuitry element and comprises at least a second conductive part 710. The second circuitry element may be an application specific integrated circuit, an interconnect, a computing circuit, a memory device or a passive device such as a resistor, a capacitor, an inductor or a combination thereof. Regardless of its kind, when electrical current flows in the second conductive part 710, it would create an internal magnetic field around it. When this magnetic field comprises a magnetic component parallel to the first surface 1001, it would be sensed by the horizontal magnetic layer 103 close by and affect an ability of the horizontal magnetic layer to sense external magnetic fields. The second shielding unit 300 is similar to the first shielding unit. It comprises at least a magnetic material and is electrically floating so as to shield the noise (internal magnetic field) created by the second conductive part 710 of the second circuitry element from affecting the horizontal magnetic layer 103 thereby increasing the sensing ability of the magnetoresistive sensing element.

The second circuitry element is distributed across the sensing region 10, shielding region 20 and/or periphery circuitry region 70. The second shielding unit 300 and the second circuitry element occupy a similar area or the second shielding unit 300 occupies an area at least comprising the sensing region 10. The vertical distance between the horizontal magnetic layer 103 and the second shielding unit 300 may be adjusted so as to render a better shielding effect. Although only one magnetic layer is provided in this embodiment as the second shielding unit 300, the second shielding unit 300 may further comprise multiple magnetic layers parallel to the first surface 1001. The thickness, occupied area, distance between different magnetic layers of these magnetic layers may be chosen, so an optimized shielding effect can be achieved.

Even though only the first circuitry element, the first shielding unit, the second circuitry element and the second shielding unit are shown in this embodiment, a person skilled in the art should know that the present invention is not limited thereto. When no first circuitry element is disposed at the periphery of the magnetoresistive sensing element, it is not necessary to dispose the first shielding unit. When no second circuitry element is disposed beneath the magnetoresistive sensing element, it is not necessary to dispose the second shielding unit. In other words, whether to dispose only the first shielding unit, only the second shielding unit or both of them depends on the layout of the magnetoresistive sensing device 1.

Figure 1A:
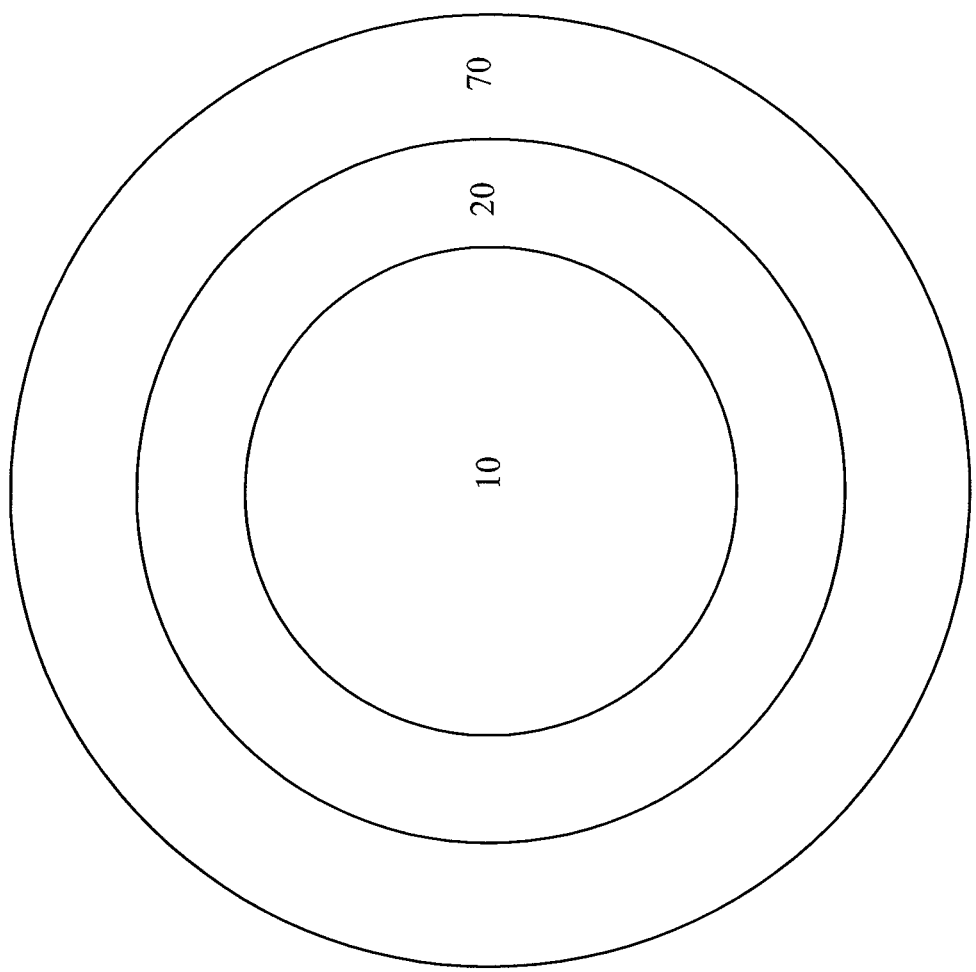
FIG. 1A is a schematic regional view of a magnetoresistive sensing device in accordance with an embodiment of the present invention.
Figure 1B:
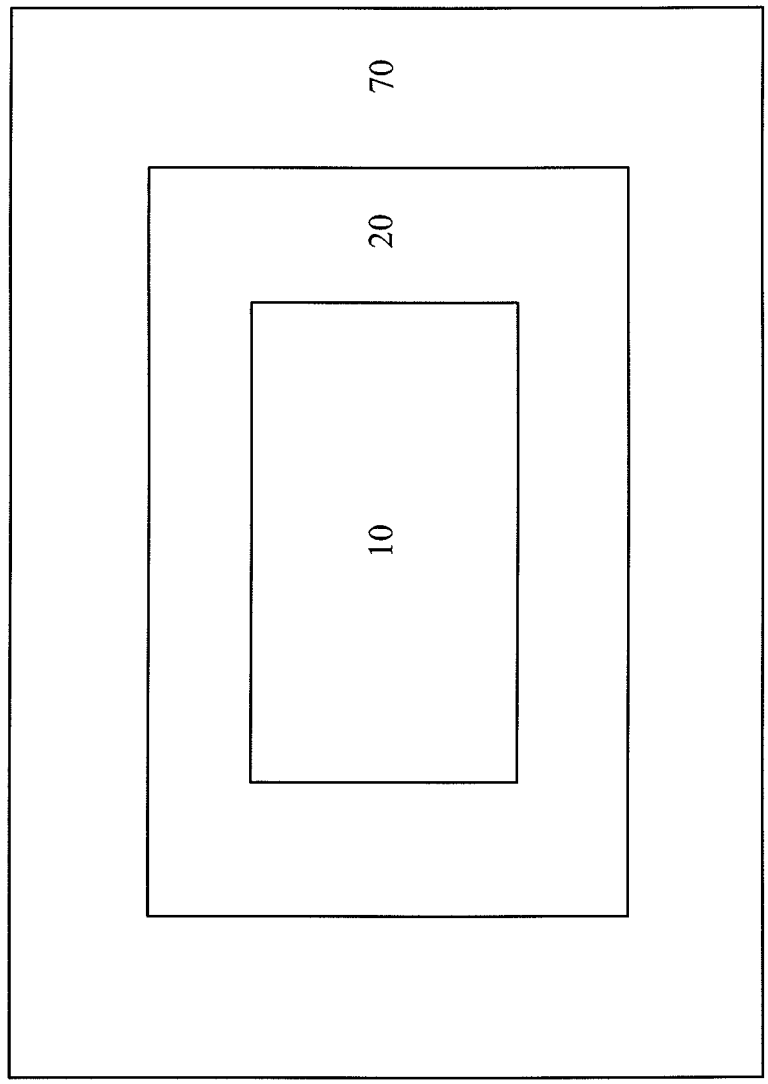
FIG. 1B is a schematic regional view of a magnetoresistive sensing device in accordance with another embodiment of the present invention.
Figure 1C:
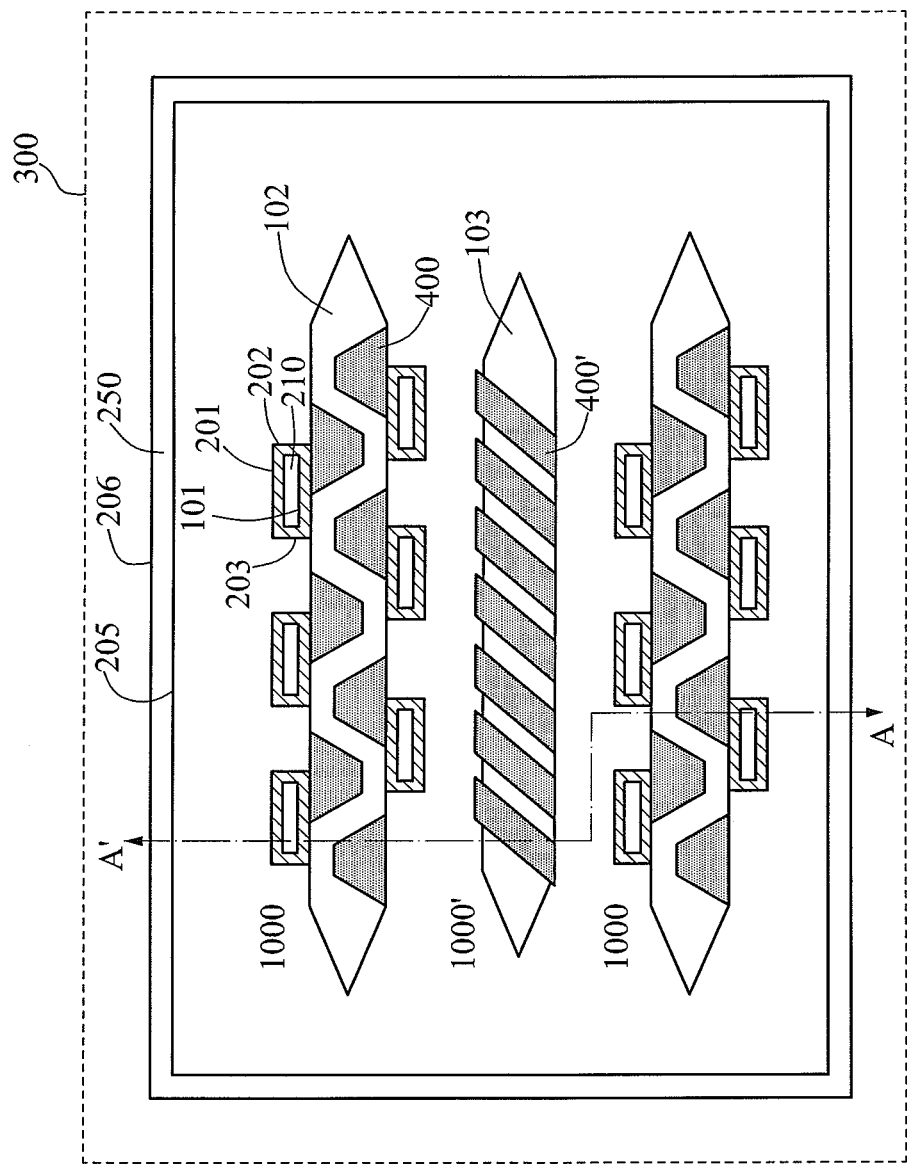
FIG. 1C is a schematic top view of the shielding unit and the magnetoresistive sensing element of a magnetoresistive sensing device in accordance with an embodiment of the present invention.

Next please refer to FIGS. 1A and 1B. FIGS. 1A and 1B are schematic regional views of the sensing region 10, shielding region 20 and periphery circuitry region of the magnetoresistive sensing device 1 in accordance with embodiments of the present invention. The sensing region 10 is in the center and the shielding region 20 is between the sensing region 10 and the periphery circuitry region and substantially surrounds the sensing region. According to different layouts and different concerns, these three regions may be deployed in a concentric circular way as shown in FIG. 1A or they may be deployed in a rectangular way as shown in FIG. 1B. However, the present invention is not limited thereto, as long as the shielding region is between the sensing region 10 and the periphery circuitry region 70, one these three regions does not have to surround the others of these three regions and these three regions may be juxtaposed.

Next, please refer to FIG. 1C. FIG. 1C is a schematic top view showing three magnetoresistive sensing elements 1000, 1000' and 1000 and the second magnetic layer 201 and the third magnetic layers 205 and 206 of the first shielding unit.

Figure 2:
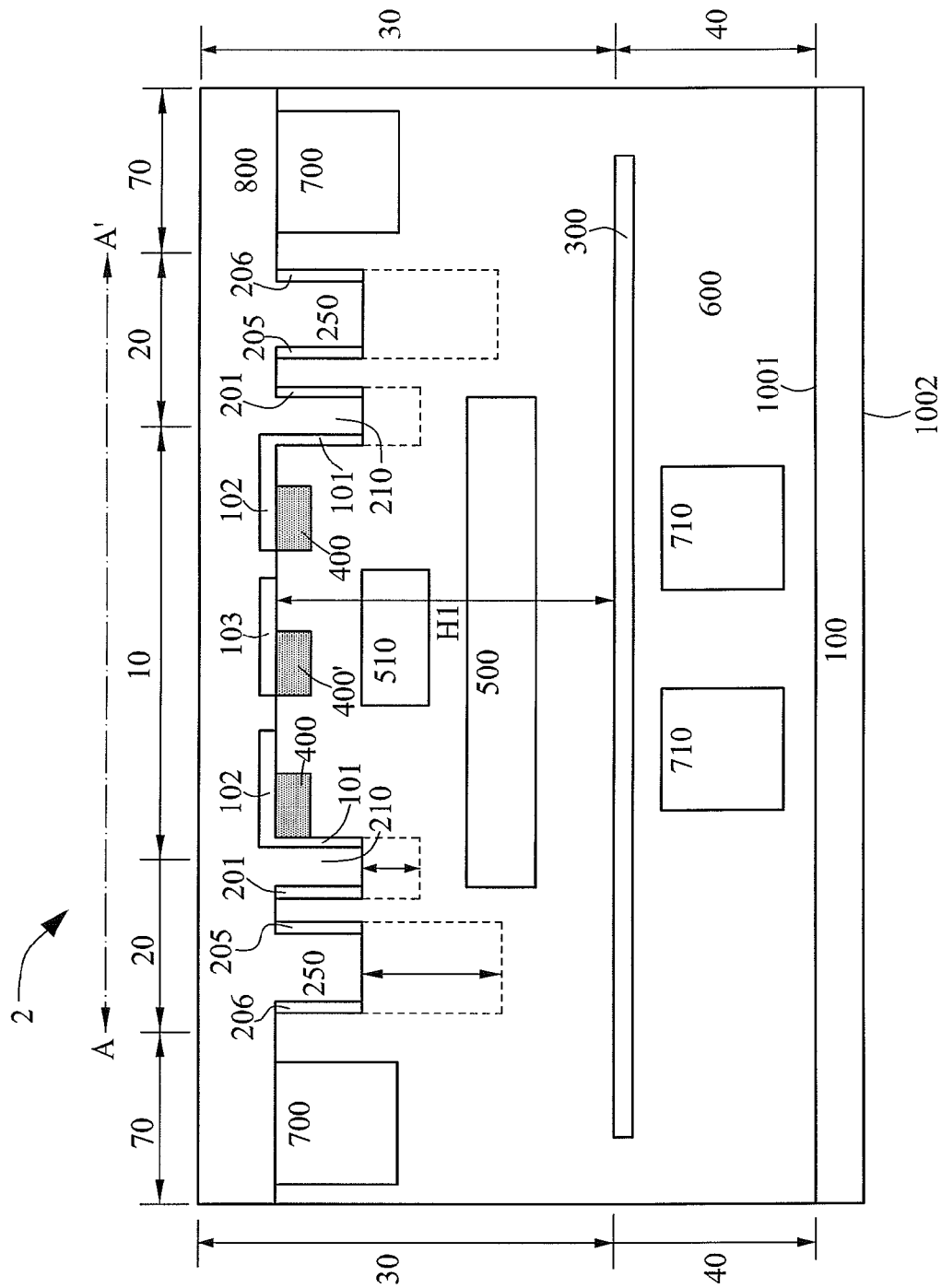
FIG. 2 is a detailed cross section view of a magnetoresistive sensing device in accordance with another embodiment of the present invention.

FIGS. 1 and 2 can be obtained by taking cross sections along cutting line A-A' of FIG. 1C. To stay on focus, FIG. 1C omits the set/reset circuit 500, compensating circuit 510 and second conductive part 710 beneath the magnetoresistive sensing elements 1000/1000'. In this embodiment, two magnetoresistive sensing elements 1000 configured to sense a magnetic field perpendicular to the first surface 1001 and one magnetoresistive sensing element 1000' configured to sense a magnetic field parallel to the first surface 1001 are juxtaposed. The magnetoresistive sensing element 1000 comprises a first extension 102, multiple conductive portions 400 above or below the first extension 102 and electrically coupled thereto (although in FIGS. 1 and 2 the conductive portions 400 are disposed below the first extension 102, they can also be disposed above the first extension 102), multiple trenches 210 disposed at the two sides of the first extension 102 alternatively, the first magnetic layer 101 disposed at one sidewall of the trench 210 and magnetically coupled to the first extension 102, the second magnetic layer 201 disposed at another sidewall of the trench 210 and opposing to the first magnetic layer 101. The first magnetic layer 101 and the second magnetic layer 201 are electrically coupled via connecting magnetic layers 202 and 203 on other sidewalls of the trench. When the first magnetic layer 101 is electrically coupled to the first extension 102 where an electrical current would flow through, the second magnetic layer 201 is not electrically floating. When the first magnetic layer 101 is physically separated from the first extension 102 where an electrical current would flow through, the second magnetic layer 201 is electrically floating. Although the second magnetic layer 201 is electrically coupled to the first magnetic layer 101, resistivity of the magnetic material is so high that a change of the magnetization of the second magnetic layer 201 would not affect the magnetic resistance of the first magnetic layer 101 electrically coupled thereto but would give shielding effect. The second magnetic layer 201 is not a continuous circular layer but multiple discrete islands at two opposite sides of the sensing region 10. This means the second magnetic layer 201 does not surround the sensing region 10, the trench 210 shown in FIG. 1 comprises multiple trenches and the first magnetic layer 101 shown in FIG. 1 also comprises multiple discrete islands. The magnetoresistive sensing element 1000' comprises a horizontal magnetic layer 103, multiple conductive portions 400' above or below the horizontal magnetic layer 103 and electrically coupled thereto (although in FIGS. 1 and 2 the conductive portions 400' are disposed below the horizontal magnetic layer 103, they can also be disposed above the horizontal magnetic layer 103). Even though the third magnetic layers 205 and 206 both are continuous layers, they may also comprise multiple discrete islands surrounding the magnetoresistive sensing elements 1000/1000' hence substantially surrounding the second magnetic layer 201. A person skilled in the art should know that the first shielding unit may have as many magnetic layers as needed, each of them may be a continuous layer or comprises multiple discrete islands, and each of them may have an adjustable downward extending depth according to the depth of the trench accommodating it. Therefore, the trench 250 may comprise multiple trenches so the third magnetic layers 205 and 206 both comprise multiple discrete islands. The second shielding unit 300 is right below the magnetoresistive sensing elements 1000/1000' and the first shielding unit (that is the second magnetic layer 201, the third magnetic layers 205 and 206) and is laterally extending beyond the sensing region 10 and the shielding region 20. However in other embodiments, the extending area of the second shielding unit may be adjusted to render it at least beneath the sensing region 10.

Even though three magnetoresistive sensing elements 1000, 1000' and 1000 are shown in FIG. 1, a person skilled in the art should understand there may be less than three or more than three magnetoresistive sensing elements of the same or different kinds in any combination and disposed in any way in the sensing region 10 of FIG. 1. For example, the sensing region of FIG. 1 may comprise a Wheatstone bridge structure configured to sense a magnetic field of a specific direction and this Wheatstone bridge structure may comprise four resistive arms each of which may comprise at least one magnetoresistive sensing element. Furthermore, the sensing region of FIG. 1 may comprise multiple Wheatstone bridge structures configured to sense multiple magnetic fields of different directions and each one of these Wheatstone bridge structures may comprise four resistive arms each of which may comprise at least one magnetoresistive sensing element. A person skilled in the art should know the amount of the magnetoresistive sensing elements disposed in the sensing region, where they are disposed, the functions of them, etc. are all factors that would affect the second magnetic layer 201 of the first shielding unit. Whether to deploy the second magnetic layer 201, how many of them should be deployed, where should they be disposed and whether they can surround the sensing region 10 are all depending on these factors. The present invention is intended to cover all the modifications accordingly.

Next, please refer to FIG. 2. FIG. 2 shows a detailed cross sectional view of a magnetoresistive sensing device in accordance with another embodiment of the present invention. This magnetoresistive sensing device 2 not only comprises all the regions, elements and units shown in FIG. 1 but also optionally comprises a set/reset circuit 500 and a compensating circuit 510 between the magnetoresistive sensing elements and the second shielding unit 300. The set/reset circuit 500 is configured to adjust the magnetization direction of the magnetic layers before the magnetoresistive sensing elements being used and the compensating circuit 510 is configured to compensate a known error/deviation of the magnetoresistive sensing elements. In other applications, the compensating circuit 510 may be designed into a built-in self testing circuit. Since these circuits may not perform their functions properly if they are too far away from the magnetoresistive sensing elements, they can not be isolated/shielded by the second shielding unit. Therefore, these circuits should be taken as a part of the magnetoresistive sensing device and should not be viewed as the first conductive parts 700 and 710 of FIG. 2.

The magnetoresistive sensing device according to the present invention has a shielding unit disposed between the magnetoresistive sensing elements and the circuitry elements to shield the magnetoresistive sensing elements from adverse influences. Moreover, the first magnetic layer 101 of the magnetoresistive sensing element, the second magnetic layer 201 and the third magnetic layers 205 and 206 are all disposed on sidewalls of trenches, so they can be fabricated by the following processes. At first, form trenches 210 and 250 in the substrate by the same photolithography using the same photo mask. When trenches 210 and 250 have the same trench width after an etching process, the more likely they may have the same depth. When trenches 210 and 250 have different trench widths after an etching process, the more likely they may have different depths. Or, if it is intended to form the trenches 210 and 250 with different depths, different photo masks and/or different photolithography processes and/or different etching processes may be used to form them. And then, blanketly form a magnetic layer on the substrate so this magnetic layer is conformally formed on the bottom and sidewalls of the trenches 210 and 250. Afterward, optionally form a patterned hard mask layer on the substrate by a photolithography process using a photo mask depending on the patterns/shapes of the magnetic layers to be formed. Anisotropically etch away portions of the magnetic layer that are not covered by the patterned hard mask layer (in a situation where the patterned hard mask layer is used) or etch back the magnetic layer (in a situation where the patterned hard mask layer is not used) so as to remove the magnetic layer on the substrate surface and on the bottom of the trenches and to form spacers of the magnetic layer on the sidewalls of the trenches as the first magnetic layer 101 of the magnetoresistive sensing element, the second magnetic layer 201 and the third magnetic layers 205 and 206. By using these processes, a design involving the magnetic layers 205 and 206 having different thicknesses from the magnetic layers 101 and 201 can be achieved, so functions of the magnetoresistive sensing device and the shielding units can be optimized. The shielding units of the present invention can enable integration of various circuitries and magnetoresistive sensing devices into one single chip without increasing complexity and cost of the fabricating process and it advantageously decrease or eliminate the interference caused upon the magnetoresistive sensing elements by these circuitries.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A magnetoresistive sensing device, comprising:
    a substrate, having a first surface and a dielectric layer above the first surface;
    a trench disposed in the dielectric layer and having sidewalls;
    a magnetoresistive sensing element having a first magnetic layer on one of the sidewalls without filling up the trench;
    a circuitry element disposed above the first surface; and
    a shielding unit disposed above the first surface,
    wherein the shielding unit is between the magnetoresistive sensing element and the circuitry element and comprises a second magnetic layer on another one of the sidewalls without filling up the trench.

2. The magnetoresistive sensing device of claim 1, wherein the second magnetic layer comprises at least one of anisotropic magnetoresistance (AMR) material, giant magnetoresistance material (GMR) and tunneling magnetoresistance material (TMR).

3. The magnetoresistive sensing device of claim 1, wherein a resistance of the magnetoresistive sensing element changes along with an external magnetic field, and the magnetoresistive sensing element comprises at least one of ferromagnet material, antiferromagnet, non-ferromagnet material, tunneling oxide or any combination thereof.

4. The magnetoresistive sensing device of claim 1, wherein the circuitry element, the shielding unit and the magnetoresistive sensing element are disposed along a direction substantially perpendicular to the first surface.

5. The magnetoresistive sensing device of claim 1, further comprising at least one selected from the group consisting of a set/reset circuit, a built-in self testing unit, and a compensating unit.

6. The magnetoresistive sensing device of claim 1, wherein the circuitry element comprises at least one selected from the group consisting of an application specific integrated circuit, an interconnect, a computing circuit, a memory device, a passive device, a resistor, a capacitor, and an inductor.

7. The magnetoresistive sensing device of claim 1, wherein circuitry element, the shielding unit and the magnetoresistive sensing element are disposed along a direction parallel to the first surface and the shielding unit is at periphery of the magnetoresistive sensing element.

8. The magnetoresistive sensing device of claim 1, wherein the first magnetic layer has a first horizontal extension at its upper end and magnetically coupled thereto.

9. The magnetoresistive sensing device of claim 8, the first magnetic layer has a second horizontal extension at its lower end and magnetically coupled thereto.

10. The magnetoresistive sensing device of claim 1, wherein the first magnetic layer and the second magnetic layer comprise the same magnetic material.

11. The magnetoresistive sensing device of claim 1, wherein the shielding unit further comprises a third magnetic layer not parallel to the first surface and the third magnetic layer is at periphery of the second magnetic layer.

12. The magnetoresistive sensing device of claim 1, wherein the second magnetic layer takes a form of a continuous layer or multiple discrete islands surrounding the magnetoresistive sensing element.

13. The magnetoresistive sensing device of claim 1, wherein a distance between the lower end of the first magnetic layer and the first surface is equivalent to or smaller than a distance between the lower end of the second magnetic layer and the first surface.

14. The magnetoresistive sensing device of claim 1, wherein the shielding unit is beneath the magnetoresistive sensing element.

15. A method for fabricating a magnetoresistive sensing device, comprising:
    providing a substrate having a first surface and a dielectric layer above the first surface;
    forming a first trench having sidewalls in the dielectric layer;
    forming a magnetoresistive sensing element having a first magnetic layer on one of the sidewalls of the first trench without filling up the first trench; and
    forming at least one shielding unit having a second magnetic layer on another one of the sidewalls of the first trench without filling up the first trench.

16. The method for fabricating a magnetoresistive sensing device of claim 15, further comprising:
    forming a second trench; and
    forming at least a third magnetic layer not parallel to the first surface on a sidewall of the second trench,
    wherein the third magnetic layer is electrically floating.

17. The method for fabricating a magnetoresistive sensing device of claim 16, wherein the first trench and the second trench are formed by the same or different photo masks, the same or different photolithography processes, or the same or different etching processes.

18. The method for fabricating a magnetoresistive sensing device of claim 16, wherein the first trench and the second trench have the same or different widths or have the same or different depths.

19. The method for fabricating a magnetoresistive sensing device of claim 15, further comprising forming a magnetic layer parallel to the first surface beneath the magnetoresistive sensing element.

* * * * *